(12) United States Patent
Luo et al.

(10) Patent No.: US 12,017,248 B2
(45) Date of Patent: Jun. 25, 2024

(54) FILM MANUFACTURING EQUIPMENT AND METHOD OF MANUFACTURING FILM

(71) Applicant: Beyond Manufacture Inc., New Taipei (TW)

(72) Inventors: Chun-Hao Luo, New Taipei (TW); Ren-Yu Liao, New Taipei (TW)

(73) Assignee: BEYOND MANUFACTURE INC., New Taipei (TW)

( * ) Notice: Subject to any disclaimer, the term of this patent is extended or adjusted under 35 U.S.C. 154(b) by 0 days.

(21) Appl. No.: 18/148,892

(22) Filed: Dec. 30, 2022

(65) Prior Publication Data
US 2024/0100557 A1   Mar. 28, 2024

(30) Foreign Application Priority Data
Sep. 28, 2022 (TW) ................... 111136829

(51) Int. Cl.
*B05C 5/02* (2006.01)
*B05D 3/02* (2006.01)
*B05D 3/04* (2006.01)
*G03F 7/16* (2006.01)

(52) U.S. Cl.
CPC .......... *B05C 5/0245* (2013.01); *B05D 3/0254* (2013.01); *B05D 3/0406* (2013.01); *G03F 7/168* (2013.01)

(58) Field of Classification Search
USPC ............. 118/325, 58, 62, 63, 404, 405, 421
See application file for complete search history.

(56) References Cited

U.S. PATENT DOCUMENTS

| | | | | |
|---|---|---|---|---|
| 3,669,073 A * | 6/1972 | Savit | ................... | G03G 15/101 399/240 |
| 10,190,018 B2 | 1/2019 | Jain et al. | | |
| 2002/0191975 A1 * | 12/2002 | Hyodo | ..................... | G03D 3/02 396/565 |
| 2011/0242200 A1 * | 10/2011 | Tojo | ....................... | B41M 7/009 347/21 |
| 2018/0067454 A1 * | 3/2018 | Takada | ................. | G03G 21/206 |

FOREIGN PATENT DOCUMENTS

| | | |
|---|---|---|
| CN | 112474228 A | 3/2021 |
| JP | 2005034748 A | 2/2005 |
| JP | 2007007571 A | 1/2007 |
| TW | 200846088 A | 12/2008 |
| TW | 201313866 A | 4/2013 |
| TW | 201712082 A | 4/2017 |

\* cited by examiner

*Primary Examiner* — Yewebdar T Tadesse
(74) *Attorney, Agent, or Firm* — Rabin & Berdo. P.C.

(57) ABSTRACT

A film manufacturing equipment includes a transporting device, a filtering device, a coating device, a baking device and a blowing device. Transporting device is configured to transport a substrate. The filtering device is configured to filter a solution. The coating device is configured to squeeze and coat the filtered solution on the substrate. The baking device is configured to bake the solution coated on the substrate. The blowing device is configured to blow an air to the baked solution.

7 Claims, 4 Drawing Sheets

FILM MANUFACTURING EQUIPMENT AND METHOD OF MANUFACTURING FILM

RELATED APPLICATIONS

This application claims priority to Taiwanese Application Serial Number 111136829 filed Sep. 28, 2022, which is herein incorporated by reference.

BACKGROUND

Technical Field

The present disclosure relates to film manufacturing equipment and method of manufacturing film by this film manufacturing equipment.

Description of Related Art

With the raging epidemic around the world in recent years, people are actively using medical-grade personal protective equipment in order to protect themselves and their families. Consequently, medical masks have become indispensable daily necessities nowadays.

In general, bioporous membrane is an important material for making medical masks. Therefore, the way to effectively improve the production capacity and the yield of bioporous membranes at a low cost and under environmental protection, so as to avoid the shortage of medical masks in the market, is undoubtedly an important issue which the industry highly concerns.

SUMMARY

A technical aspect of the present disclosure is to provide a film manufacturing equipment, which can effectively enhance the efficiency and quality of manufacture of the film.

According to an embodiment of the present disclosure, a film manufacturing equipment includes a transporting device, a filtering device, a coating device, a baking device and a blowing device. Transporting device is configured to transport a substrate. The filtering device is configured to filter a solution. The coating device is configured to squeeze and coat the filtered solution on the substrate. The baking device is configured to bake the solution coated on the substrate. The blowing device is configured to blow an air to the baked solution.

In one or more embodiments of the present disclosure, the filtering device includes at least one filtering material. The filtering material has a plurality of filtering holes. A dimension of each of the filtering holes is ranged between 5 microns and 50 microns.

In one or more embodiments of the present disclosure, the coating device is configured to deliver the filtered solution to the substrate along a first direction. The transporting device is configured to transport the substrate along a second direction. The first direction mutually intersects with the second direction.

In one or more embodiments of the present disclosure, the coating device includes a main body, a first moving portion and a second moving portion. The main body has a first delivery duct. The first delivery duct is configured to allow the filtered solution to flow through. The first moving portion is slidably connected with the main body along a third direction. The third direction is inclined to the first direction. The second moving portion is slidably connected with the main body along a fourth direction. The fourth direction is perpendicular to the first direction. The first moving portion and the second moving portion define a second delivery duct therebetween. The second delivery duct is located between the first delivery duct and the transporting device. The second delivery duct is at least partially communicated with the first delivery duct along the first direction.

In one or more embodiments of the present disclosure, the first delivery duct has a first width. The second delivery duct has a second width. The first width is larger than the second width.

In one or more embodiments of the present disclosure, the first width is ranged between 6 mm and 12 mm. The second width is ranged between 5 mm and 10 mm.

In one or more embodiments of the present disclosure, the second moving portion includes a first guiding surface and a second guiding surface. The first guiding surface defines the second delivery duct. The second guiding surface at least partially faces to the transporting device and is at least partially inclined to the first guiding surface. The second guiding surface has a first edge and a second edge opposite to the first edge. The first edge is connected with the first guiding surface. The second edge and the transporting device are separated from each other by a distance.

In one or more embodiments of the present disclosure, the distance is ranged between 200 microns and 2,000 microns.

In one or more embodiments of the present disclosure, the second guiding surface includes a first subsidiary guiding surface and a second subsidiary guiding surface. The second subsidiary guiding surface is connected with the first subsidiary guiding surface. The first edge is located at the first subsidiary guiding surface. The second edge is located at the second subsidiary guiding surface. The first subsidiary guiding surface is connected between the first guiding surface and the second subsidiary guiding surface. The first subsidiary guiding surface is inclined to the first guiding surface and the second subsidiary guiding surface.

A technical aspect of the present disclosure is to provide a method of manufacturing film, which can effectively enhance the efficiency and quality of manufacture of the film.

According to an embodiment of the present disclosure, a method of manufacturing a film includes: (1) transporting a substrate; (2) filtering a solution, a viscosity of the solution being ranged between 100 cPs and 2000 cPs, a solid content of the solution being ranged between 5% and 17%; (3) coating the filtered solution on the substrate; (4) baking the solution coated on the substrate; and (5) blowing an air to the baked solution.

In one or more embodiments of the present disclosure, the operation of filtering the solution includes: filtering the solution by a filtering material. The filtering material has a plurality of filtering holes. A dimension of each of the filtering holes is ranged between 5 microns and 50 microns.

In one or more embodiments of the present disclosure, the operation of baking the solution coated on the substrate includes: removing 40%-70% of the solution on the substrate.

In one or more embodiments of the present disclosure, the operation of coating the filtered solution on the substrate includes: squeezing and coating the filtered solution on the substrate by a coating device. The method further includes: maintaining a minimum distance between the coating device and the substrate. The minimum distance is ranged between 200 microns and 2,000 microns.

In one or more embodiments of the present disclosure, the operation of squeezing the filtered solution includes: adjusting a flowrate of squeezing the solution.

In one or more embodiments of the present disclosure, the operation of transporting the substrate includes: adjusting a moving speed of transporting the substrate.

The above-mentioned embodiments of the present disclosure have at least the following advantages:

(1) Since the coating device squeezes and coats the filtered solution of a high degree of viscosity on the substrate, after the baking device removes 40%-70% of the solution on the substrate, the blowing device can be immediately applied to blow an air to the solution in order to remove the tiny dust remained on the solution. Thus, the efficiency and quality of manufacture of the film can be effectively enhanced.

(2) Since the operations of the manufacturing method of a film are simple and easy, various losses in the manufacturing process can be effectively reduced, which can achieve the purpose of simplification and environmental protection during production.

(3) During the operation of the film manufacturing equipment, through maintaining the magnitude of the distance between the coating device and the substrate, and adjusting the flowrate of squeezing the solution from the coating device and a moving speed of transporting the substrate, the manufacturing quality of the film can be enhanced.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
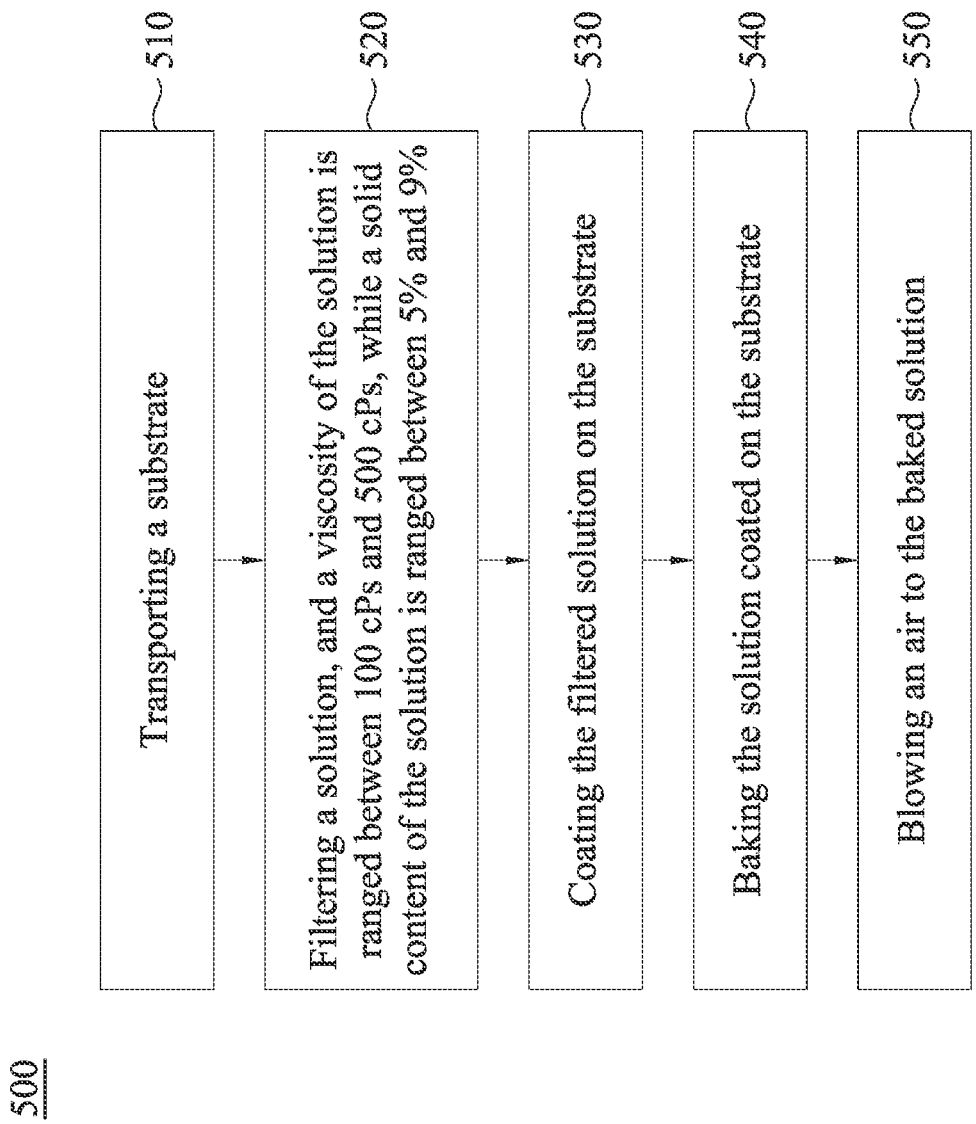
FIG. 1 is a flow diagram of a manufacturing method of a film according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
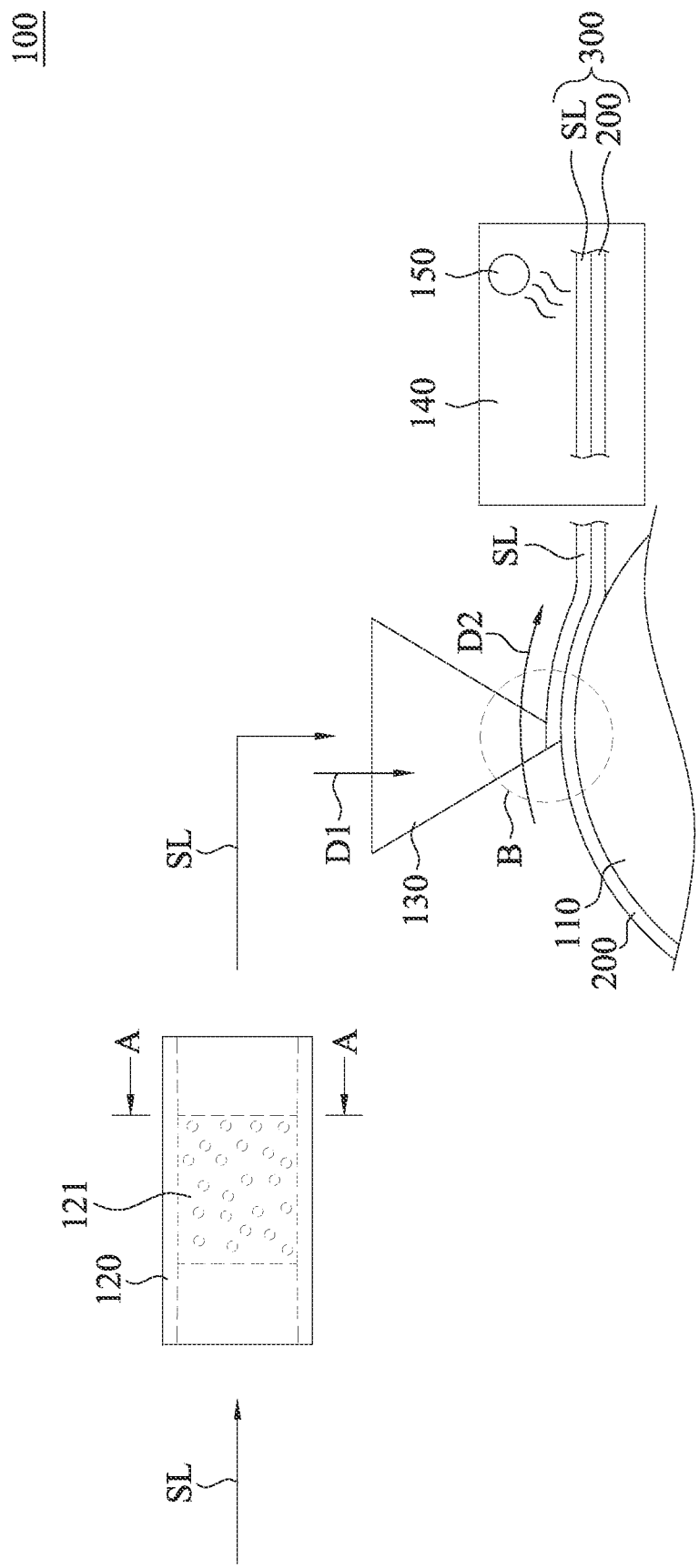
FIG. 2 is a structural presentation of a film manufacturing equipment according to an embodiment of the present disclosure.

Reference is made to FIG. 1. FIG. 1 is a flow diagram of a manufacturing method 500 of a film according to an embodiment of the present disclosure. In this embodiment, as shown in FIG. 1, a manufacturing method 500 of a film includes the following operations (it is appreciated that the sequence of the operations and the sub-operations as mentioned below, unless otherwise specified, can all be adjusted upon the actual needs, or even executed at the same time or partially at the same time):

(1) Transporting a substrate 200 (Operation 510). Reference is made to FIG. 2. FIG. 2 is a structural presentation of a film manufacturing equipment 100 according to an embodiment of the present disclosure. To be specific, in this embodiment, as shown in FIG. 2, a film manufacturing equipment 100 includes a transporting device 110. A substrate 200 is at least partially disposed on the transporting device 110, and the transporting device 110 is configured to transport the substrate 200 along a second direction D2. For example, the transporting device 110 drives the substrate 200 to displace through rotation, such that the second direction D2 is practically of a curved track. In practical applications, for example, the substrate 200 can be of flexible material, and a thickness of the substrate 200 is about 100 microns. However, this does not intend the present disclosure.

(2) Filtering a solution SL, and a viscosity of the solution SL is ranged between 100 cPs and 2000 cPs, while a solid content of the solution SL is ranged between 5% and 17% (Operation 520). In this embodiment, as shown in FIG. 2, the film manufacturing equipment 100 includes a filtering device 120. The filtering device 120 is configured to filter the solution SL. Since the viscosity of the solution SL is ranged between 100 cPs and 2000 cPs, the solution SL has a high degree of viscosity.

Figure 3:
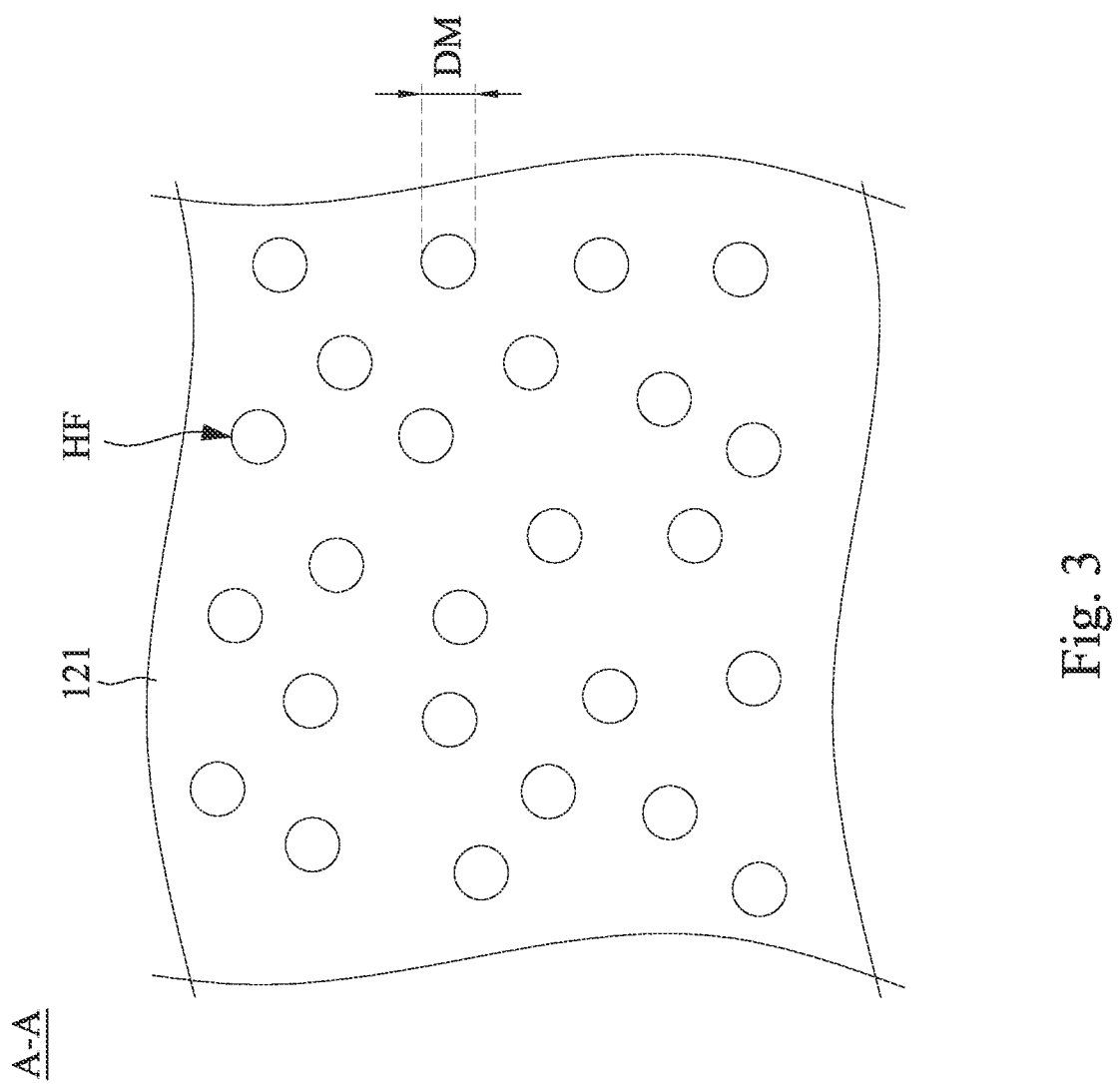
FIG. 3 is a partially cross-sectional view along the section line A-A of FIG. 2.

Reference is made to FIG. 3. FIG. 3 is a partially cross-sectional view along the section line A-A of FIG. 2. In this embodiment, as shown in FIGS. 2-3, the filtering device 120 includes at least one filtering material 121. The filtering material 121 has a plurality of filtering holes HF. A dimension of each of the filtering holes HF is ranged between 5 microns and 50 microns. As shown in FIG. 3, the dimension of each of the filtering holes HF is its diameter DM. This means the diameter DM of each of the filtering holes HF is ranged between 5 microns and 50 microns. Thus, when the solution SL passes through the filtering material 121 of the filtering device 120, particles, which are uneasy to float but visible and over, for example, 50 microns, in the solution SL can be effectively removed by the filtering material 121.

In addition, in this embodiment, as shown in FIG. 1, the manufacturing method 500 of a film further includes the following operations:

(3) Coating the filtered solution SL on the substrate 200 (Operation 530). In this embodiment, as shown in FIG. 2, the film manufacturing equipment 100 includes a coating device 130. The coating device 130 is configured to receive the solution SL filtered by the filtering device 120 and to deliver the filtered solution SL along a first direction D1 to the substrate 200 disposed on the transporting device 110. The first direction D1 mutually intersects with the second direction D2. For example, the first direction D1 and the second direction D2 are perpendicular with each other. However, this does not intend to limit the present disclosure. To be specific, the coating device 130 is configured to squeeze and coat perpendicularly the filtered solution SL on the substrate 200 being transported by the transporting device 110.

(4) Baking the solution SL coated on the substrate 200 (Operation 540). In this embodiment, as shown in FIG. 2, the film manufacturing equipment 100 includes a baking device 140. The baking device 140 is configured to bake the solution SL coated on the substrate 200. To be more specific, the baking device 140 is configured to remove 40%-70% of the solution SL on the substrate 200, in order to remove the excessive solution SL on the substrate 200 and to speed up the solidification of the solution SL.

(5) Blowing an air to the baked solution SL (Operation 550). In this embodiment, as shown in FIG. 2, the film manufacturing equipment 100 includes a blowing device 150. For example, structurally speaking, the blowing device 150 can be at least partially located inside the baking device 140. However, this does not intend to limit the present disclosure. The blowing device 150 is configured to, for example, blow an air to the baked solution SL at the final stage of baking, in order to remove the tiny dust remained on the solidified solution SL. After blowing, the manufacture of the film 300 is finished. Afterwards, the film 300 can be used, for example, to fabricate medical masks. However, this does not intend to limit the present disclosure.

In simple words, since the coating device 130 squeezes and coats the filtered solution SL of a high degree of viscosity on the substrate 200, after the baking device 140 removes 40%-70% of the solution SL on the substrate 200, the blowing device 150 can be immediately applied to blow an air to the solution SL in order to remove the tiny dust remained on the solution SL. Thus, the efficiency and quality of manufacture of the film 300 can be effectively enhanced. Preferably, the application of the manufacturing method 500 of a film can increase the production efficiency of the film 300 by 30%-50%.

Furthermore, as mentioned above, since the operations of the manufacturing method 500 of a film are simple and easy, various losses in the manufacturing process can be effectively reduced, which can achieve the purpose of simplification and environmental protection during production.

Figure 4:
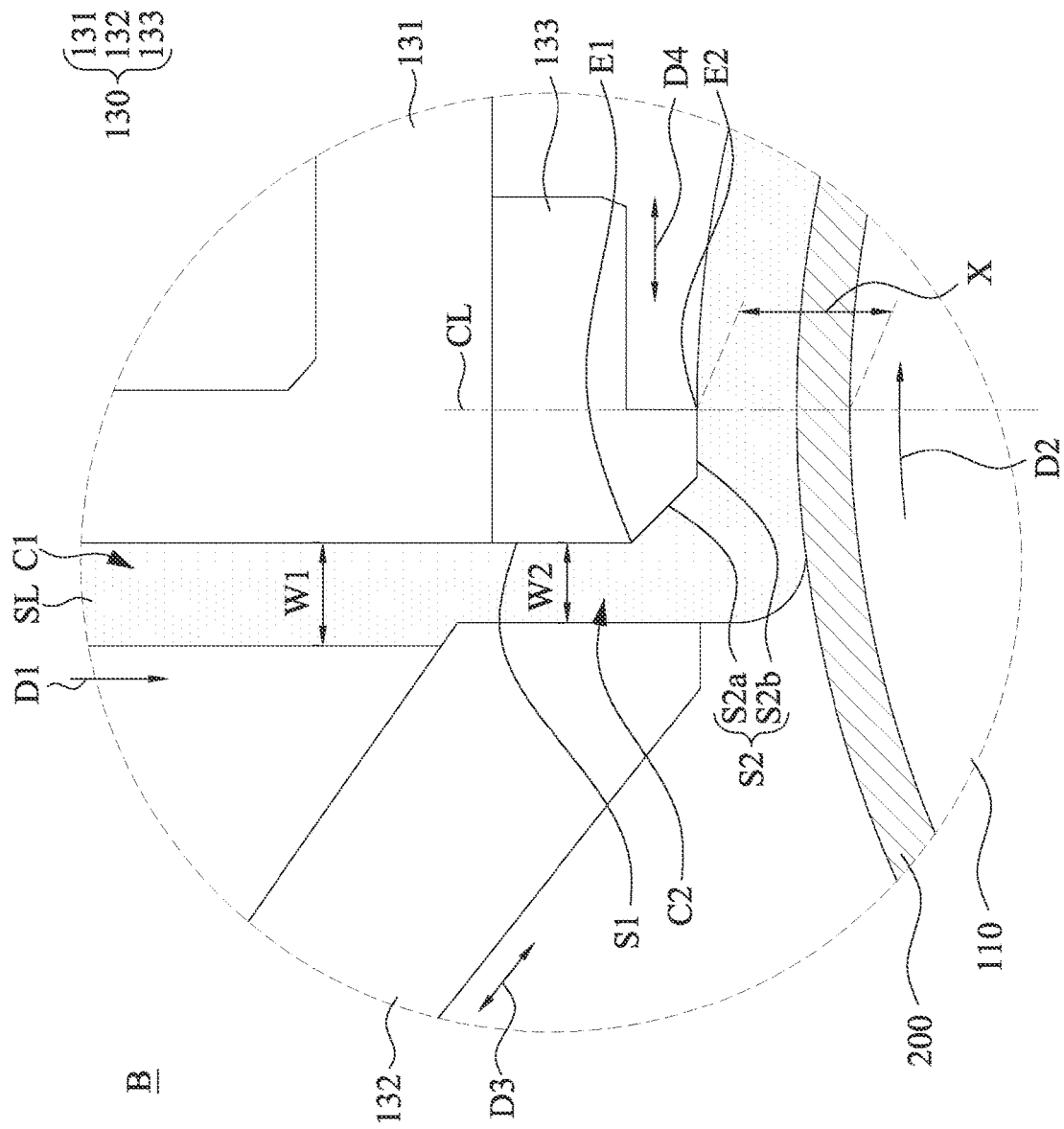
FIG. 4 is a partially enlarged view of the region B of FIG. 2.

Reference is made to FIG. 4. FIG. 4 is a partially enlarged view of the region B of FIG. 2. In this embodiment, as shown in FIG. 4, the coating device 130 includes a main body 131, a first moving portion 132 and a second moving portion 133. The main body 131 has a first delivery duct C1. The first delivery duct C1 is configured to allow the filtered solution SL to flow through. The first moving portion 132 is slidably connected with the main body 131 along a third direction D3. The third direction D3 is inclined to the first direction D1. For example, the third direction D3 is inclined to the first direction D1 by 45 degrees. However, this does not intend to limit the present disclosure. The second moving portion 133 is slidably connected with the main body 131 along a fourth direction D4. The fourth direction D4 is perpendicular to the first direction D1. The first moving portion 132 and the second moving portion 133 define a second delivery duct C2 therebetween. Since the first moving portion 132 and the second moving portion 133 are located between the main body 131 and the transporting device 110, the second delivery duct C2 is located between the first delivery duct C1 and the transporting device 110, and the second delivery duct C2 is at least partially communicated with the first delivery duct C1 along the first direction D1. In other words, the solution SL at least partially flows through the first delivery duct C1 first along the first direction D1, and then flows through the second delivery duct C2. Afterwards, the solution SL leaves the coating device 130 and arrives at the substrate 200.

In addition, as shown in FIG. 4, the first delivery duct C1 of the coating device 130 has a first width W1. The second delivery duct C2 has a second width W2. The first width W1 is larger than the second width W2. By sliding the first moving portion 132 relative to the main body 131 along the third direction D3 and/or sliding the second moving portion 133 relative to the main body 131 along the fourth direction D4, the second width W2 of the second delivery duct C2 can be adjusted according to the actual situations, so as to control and adjust a flowrate of squeezing the solution SL from the coating device 130. In practical applications, for example, a range of the first width W1 can be set to be between 6 mm and 12 mm, and a range of the second width W2 can be correspondingly adjusted between 5 mm and 10 mm.

Moreover, as shown in FIG. 4, the second moving portion 133 of the coating device 130 includes a first guiding surface S1 and a second guiding surface S2. The first guiding surface S1 defines the second delivery duct C2. The second guiding surface S2 at least partially faces to the transporting device 110 and is at least partially inclined to the first guiding surface S1. Furthermore, the second guiding surface S2 has a first edge E1 and a second edge E2 opposite to the first edge E1. The first edge E1 is connected with the first guiding surface S1. The second edge E2 is away from the first guiding surface S1. The second edge E2 and the transporting device 110 are separated from each other by a distance X along a center line CL, and the center line CL penetrates through a rotational axis (not shown) of the transporting device 110. It is worth to note that, the distance X is practically the minimum distance between the coating device 130 and the substrate 200.

To be specific, during the operation of the film manufacturing equipment 100, the transporting device 110 rotates and drives the substrate 200 to displace along the second direction D2, and the coating device 130 squeezes and coats perpendicularly (i.e., along the first direction D1) the filtered solution SL on the moving substrate 200. Then, the solution SL coated on the substrate 200 also displaces with the substrate 200 along the second direction D2 and passes through the separation between the second moving portion 133 and the transporting device 110. Thus, the second edge E2 of the second moving portion 133 provides a flattening effect to the solution SL. The distance X defines an overall thickness of the film 300 manufactured. The overall thickness is the total thickness of the substrate 200 and the solution SL coated on the substrate 200. In this way, during the operation of the film manufacturing equipment 100, through maintaining the magnitude of the distance X between the coating device 130 and the substrate 200, and adjusting the flowrate of squeezing the solution SL from the coating device 130 and a moving speed of transporting the substrate 200, the manufacturing quality of the film 300 can be enhanced. In practical applications, the distance X is ranged between 200 microns and 2,000 microns. For example, when the thickness of the substrate 200 is 100 microns, the thickness of the solution SL on the substrate 200 can be ranged between 100 microns and 1,900 microns.

To be more specific, as shown in FIG. 4, the second guiding surface S2 of the second moving portion 133 includes a first subsidiary guiding surface S2a and a second subsidiary guiding surface S2b. The second subsidiary guiding surface S2b is connected with the first subsidiary guiding surface S2a. The first edge E1 is located at the first subsidiary guiding surface S2a. The second edge E2 is located at the second subsidiary guiding surface S2b. The first subsidiary guiding surface S2a is connected between the first guiding surface S1 and the second subsidiary guiding surface S2b. The first subsidiary guiding surface S2a is inclined to the first guiding surface S1 and the second subsidiary guiding surface S2b. For example, the first subsidiary guiding surface S2a is inclined to the second subsidiary guiding surface S2b by 45 degrees. However, this does not intend to limit the present disclosure.

In conclusion, the aforementioned embodiments of the present disclosure have at least the following advantages:

(1) Since the coating device squeezes and coats the filtered solution of a high degree of viscosity on the substrate, after the baking device removes 40%-70% of the solution on the substrate, the blowing device can be immediately applied to blow an air to the solution in order to remove the tiny dust remained on the solution. Thus, the efficiency and quality of manufacture of the film can be effectively enhanced.

(2) Since the operations of the manufacturing method of a film are simple and easy, various losses in the manufacturing process can be effectively reduced, which can achieve the purpose of simplification and environmental protection during production.

(3) During the operation of the film manufacturing equipment, through maintaining the magnitude of the distance between the coating device and the substrate, and adjusting the flowrate of squeezing the solution from the coating device and a moving speed of transporting the substrate, the manufacturing quality of the film can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A film manufacturing equipment, comprising:
   a transporting device configured to transport a substrate along a first direction;
   a filtering device configured to filter a solution;
   a coating device configured to squeeze and deliver the filtered solution to the substrate along a second direction and coat the filtered solution on the substrate, the first direction mutually intersecting with the second direction, the coating device comprising:
      a main body having a first delivery duct, the first delivery duct being configured to allow the filtered solution to flow through;
      a first moving portion slidably connected with the main body along a third direction inclined to the second direction; and
      a second moving portion slidably connected with the main body along a fourth direction perpendicular to the second direction, the first moving portion and the second moving portion defining a second delivery duct therebetween, the second delivery duct being located between the first delivery duct and the transporting device, the second delivery duct being at least partially communicated with the first delivery duct along the second direction;
   a baking device configured to bake the filtered solution coated on the substrate; and
   a blowing device configured to blow an air to the baked solution.

2. The film manufacturing equipment of claim 1, wherein the filtering device comprises at least one filtering material, the filtering material has a plurality of filtering holes, a dimension of each of the filtering holes is ranged between 5 microns and 50 microns.

3. The film manufacturing equipment of claim 1, wherein the first delivery duct has a first width, the second delivery duct has a second width, the first width is larger than the second width.

4. The film manufacturing equipment of claim 3, wherein the first width is ranged between 6 mm and 12 mm, the second width is ranged between 5 mm and 10 mm.

5. The film manufacturing equipment of claim 1, wherein the second moving portion comprises:
   a first guiding surface defining the second delivery duct; and
   a second guiding surface at least partially facing to the transporting device and at least partially inclined to the first guiding surface, the second guiding surface has a first edge and a second edge opposite to the first edge, the first edge is connected with the first guiding surface, the second edge and the transporting device are separated from each other by a distance.

6. The film manufacturing equipment of claim 5, wherein the distance is ranged between 200 microns and 2,000 microns.

7. The film manufacturing equipment of claim 5, wherein the second guiding surface comprises a first subsidiary guiding surface and a second subsidiary guiding surface connected with the first subsidiary guiding surface, the first edge is located at the first subsidiary guiding surface, the second edge is located at the second subsidiary guiding surface, the first subsidiary guiding surface is connected between the first guiding surface and the second subsidiary guiding surface, the first subsidiary guiding surface is inclined to the first guiding surface and the second subsidiary guiding surface.

* * * * *